United States Patent
Kaplan (10) Patent No.: US 8,319,527 B1
(45) Date of Patent: Nov. 27, 2012

(54) ANALOG SAMPLER WITH REDUCED INPUT CURRENT

(75) Inventor: Todd Stuart Kaplan, Grass Valley, CA (US)

(73) Assignee: Linear Technology Corporation, Milpitas, CA (US)

( * ) Notice: Subject to any disclaimer, the term of this patent is extended or adjusted under 35 U.S.C. 154(b) by 255 days.

(21) Appl. No.: 12/431,349

(22) Filed: Apr. 28, 2009

(51) Int. Cl.
 *G11C 27/02* (2006.01)
(52) U.S. Cl. .......................................................... 327/91
(58) Field of Classification Search .................. 327/91, 327/94, 97–99, 554; 341/122–125, 143, 341/163, 172
 See application file for complete search history.

(56) References Cited

U.S. PATENT DOCUMENTS

| | | | |
|---|---|---|---|
| 6,064,871 A * | 5/2000 | Leung | 455/323 |
| 7,088,147 B2 * | 8/2006 | Prasad et al. | 327/91 |
| 7,088,280 B2 | 8/2006 | Oprescu | |
| 2008/0238743 A1 * | 10/2008 | Koyama | 341/131 |

* cited by examiner

*Primary Examiner* — Lincoln Donovan
*Assistant Examiner* — Shikha Goyal
(74) *Attorney, Agent, or Firm* — McDermott Will & Emery LLP (57) ABSTRACT

Methods and systems for analog to digital converter and systems incorporating the same are provided. Specifically, an analog sampler that has a reduced input current is disclosed. According to the present teaching, an apparatus for sampling an input voltage includes a first switch having its first terminal connected to an input voltage, and a first pre-charging circuit, coupled to a second terminal of the first switch, that provides a first pre-charged voltage that is substantially equal to the input voltage. The first pre-charged voltage is provided at the first terminal of the first switch before the first switch is turned on. The apparatus further includes a second pre-charging circuit coupled to both the first pre-charging circuit and the second terminal of the first switch, where the second pre-charging circuit charges the first pre-charged voltage prior to the first switch being turned on.

4 Claims, 10 Drawing Sheets

Fig. 9

ANALOG SAMPLER WITH REDUCED INPUT CURRENT

BACKGROUND

1. Technical Field

The present teaching relates generally to methods and systems for analog circuits. More specifically, the present teaching relates to methods and systems for analog to digital converter and systems incorporating the same.

2. Discussion of Technical Background

Figure 1:
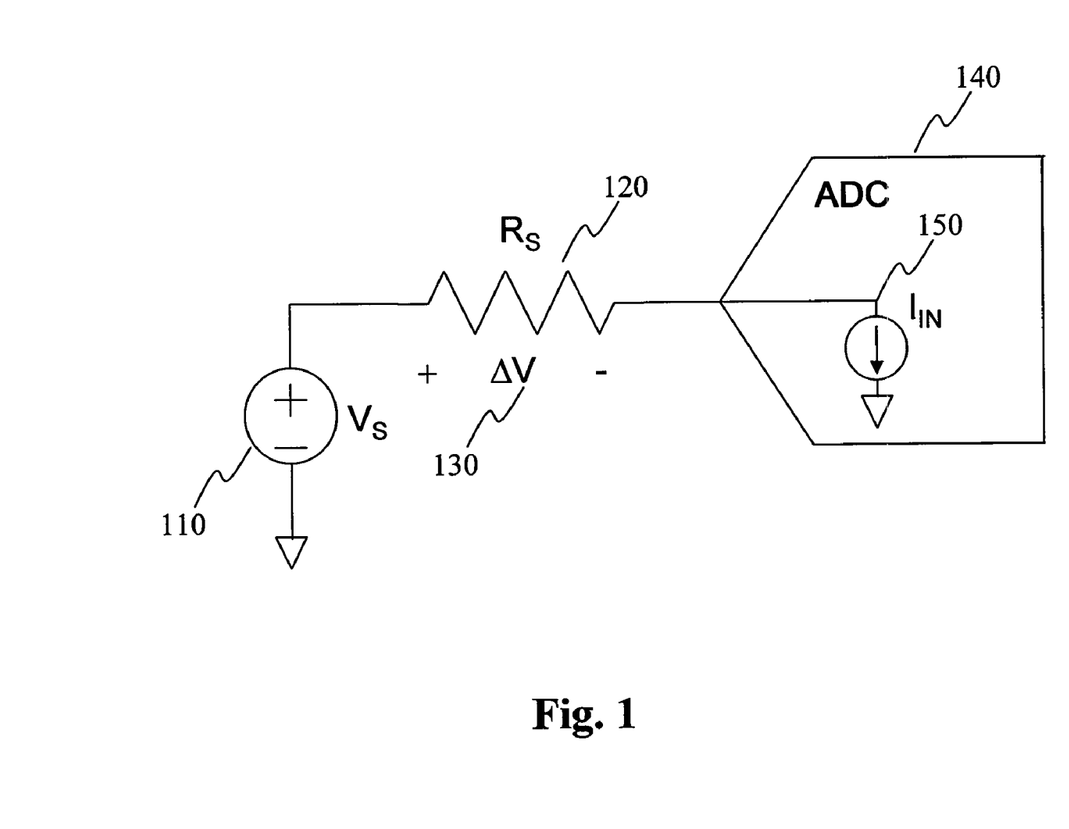
FIG. 1 depicts a typical circuit for sampling voltage in association with an analog to digital converter (ADC)

An analog to digital converter (ADC) is a widely used technology. In a circuit implementing an ADC, the analog input voltage is typically sampled and the quality of an ADC depends on the quality of voltage sampling at the input of the ADC. FIG. 1 shows a typical measurement of $V_S$ (110) using an ADC 140. A source resistance $R_S$ 120 usually accompanies $V_S$ and can be deliberately large in many situations. For example, such an ADC can be measuring the voltage in a Wheatstone bridge, and the resistors in the bridge can have large values. As another example, in certain applications, it may be desired to filter out the high-frequency components into the ADC by introducing an RC filter at the ADC input.

When $I_{IN}$ exists, it causes a voltage drop $\Delta V$ 130 across the source resistor 120. In this case, the voltage measured by the ADC will be $V_S - \Delta V$ rather than $V_S$. Thus, the input current $I_{IN}$ introduces an error into the measurement of the source voltage.

Efforts have been made to reduce such problem. For example, some prior solution introduced a buffer before an ADC and made the buffer's input impedance extremely high. There are several disadvantages to this approach, however. First, a buffer is an extra component, adding cost, size and power dissipation. Second, since no electronic device is perfect, the buffer inevitably introduces noise and distortion into the signal. Third, a buffer only works correctly in a limited voltage range. While the ADC can be designed for input voltages all the way to the supply rails, the introduction of a buffer either limits the input voltage range or requires an additional power supply for the buffer.

Figure 2:
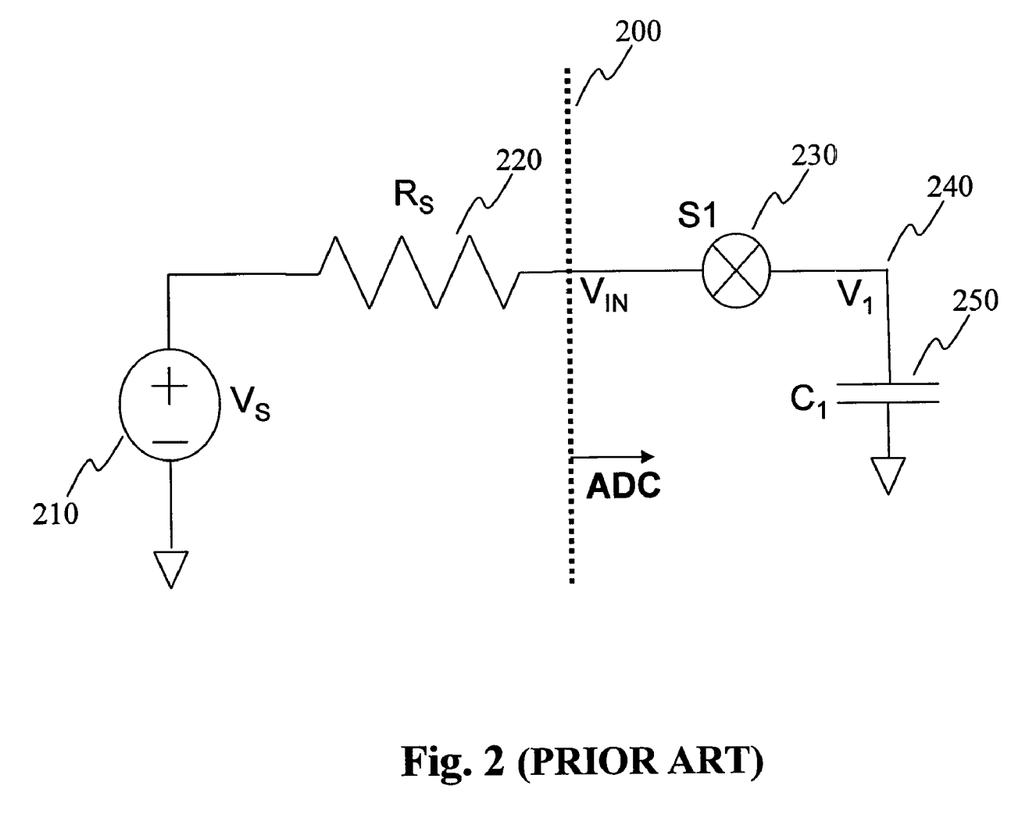
FIG. 2 (PRIOR ART) depicts a circuit for sampling voltage that incorporates an input switch.

Other embedded approaches have been adopted to minimize the input current. To understand how such approaches work, one needs to understand the basic mechanism causing ADC input current. This is shown in FIG. 2 (PRIOR ART). The first part of an ADC 200 performs a function called sample-and-hold, which samples the input voltage 200 to obtain $V_1$ (240) and then stores the sampled voltage $V_1$ (240) on a capacitor $C_1$ 250. The sampling is done by turning switch S1 230 on, and the charge is held by closing switch S1 230. If the sampled voltage $V_1$ (240) on capacitor $C_1$ 250 is different from $V_S$, there is an associated charge transferred from the input to the ADC, which is $C_1(V_S - V_1)$. If this charge transfer happens with a frequency f, the average input current is $f*C_1 (V_S - V_1)$.

Figure 3:
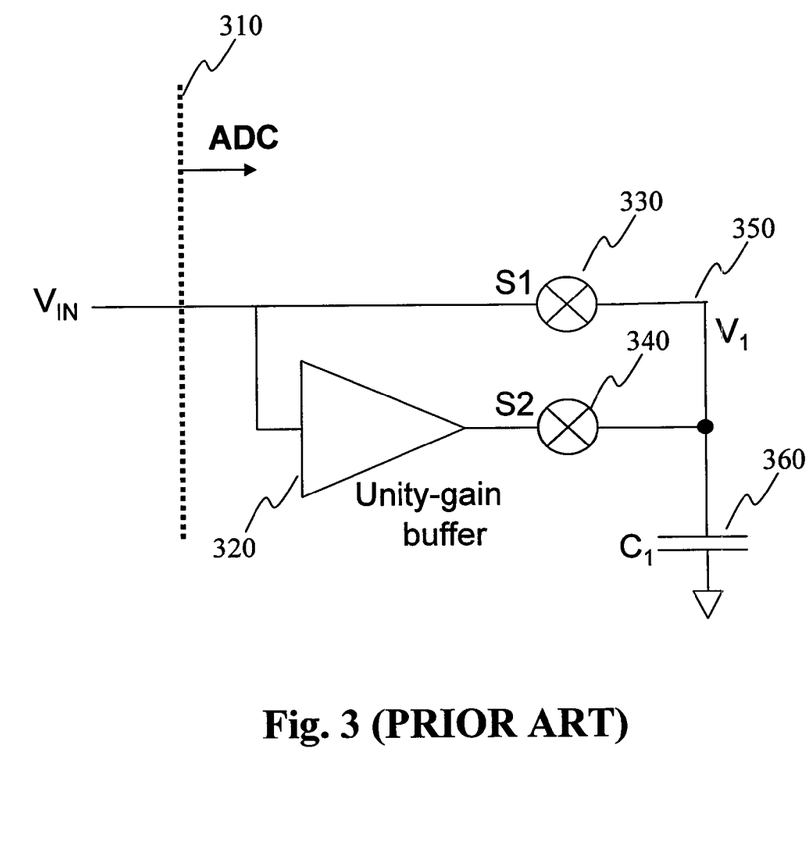
FIG. 3 (PRIOR ART) depicts a circuit for sampling voltage via pre-charging a capacitor to a desired level by employing a unit-gain buffer and a plurality of switches.

Traditionally, the input current can be minimized by pre-charging $V_1$ to $V_{IN}$ before switch S1 is turned on. Different approaches have been used to pre-charge $C_1$ to $V_{IN}$. One example method, as shown in FIG. 3 (PRIOR ART), is that an ADC 310 uses a unity-gain buffer 320 at the input to charge $C_1$ 360. Before S1 330 is turned on, S2 340 is turned on first and then turned off, pre-charging $C_1$ 360 so that $V_1$ (350)=$V_{IN}$. The unity-gain buffer 320 can be designed to have a high input impedance. Unfortunately, when the input is close to the supply rails, the unity-gain buffer 320 can not accurately reproduce $V_{IN}$ at the output of the buffer. Because of this, when it is close to the supply rails, input current still exists.

Another approach of pre-charging is disclosed in U.S. Pat. No. 7,088,280. This approach is described in FIG. 4 (PRIOR ART). With this approach, feedback from a 1-bit ADC is adopted to keep $V_1$ (470), on average, equal to $V_{IN}$ (430). If $V_{IN}=f*V_{REF+}$, and assuming an accurate ADC, then for a fraction f of the total samples $C_1$ (480) is pre-charged to $V_{REF+}$ by turning on switch S2 450, while the remainder (1−f) of the time $C_1$ 480 is pre-charged to $V_{REF−}=0$ by turning on switch S3 460. In this case, on average, $C_1$ 480 is charged to $f*V_{REF+}$. When the voltage on $C_1$ (480) is pre-charged to an average of $V_{IN}$, switch S1 440 can be turned on. At that time, because on average $V_1=V_{IN}$, there will be no input current.

Figure 4:
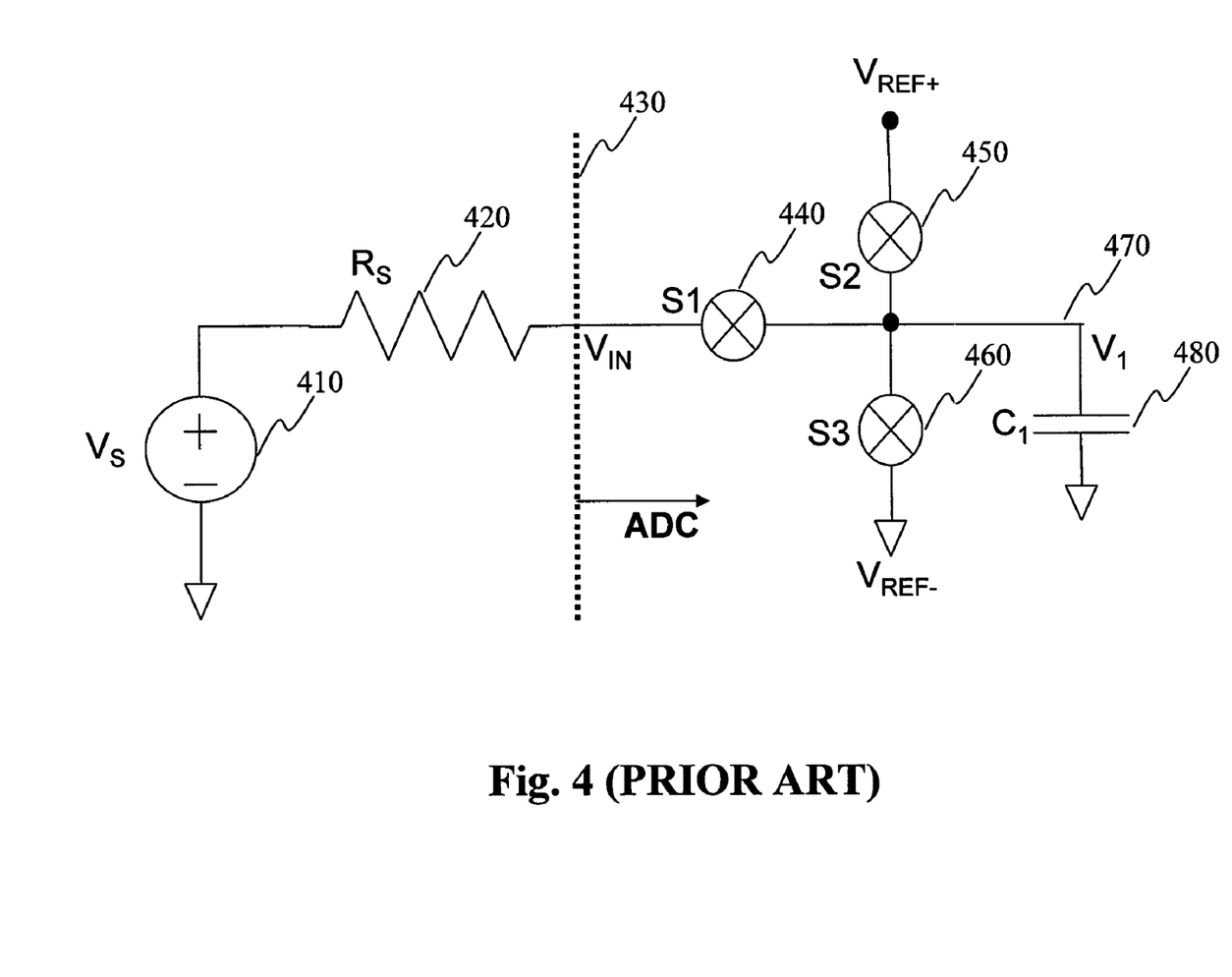
FIG. 4 (PRIOR ART) depicts a circuit for sampling voltage via pre-charging a capacitor to a desired level based on a plurality of switches.

Although this input current cancellation scheme works all the way to the supply rails, due to non-idealities in the switches, the method described in U.S. Pat. No. 7,088,280 does not completely cancel out the undesirable input current. Switches S1 440, S2 450, and S3 460 are typically composed of MOS transistors. It is well known that these transistors suffer from device capacitances and charge injection. Both charge injection and device capacitance are nonlinear functions of the voltage on the MOS terminals. Furthermore, charge injection is very difficult to model correctly. There is no guarantee that the average input current generated under these effects can be canceled out. Therefore, there is a need for a method and system that can pre-charge $C_1$ to a voltage level substantially close to $V_{IN}$ before S1 is turned on, while allowing a full rail-to-rail operation in an ADC circuit.

SUMMARY OF THE PRESENT TEACHING

The present teaching relates to methods and systems for analog to digital converter and systems incorporating the same. Specifically, the present teaching discloses an analog sampler that has a reduced input current. According to one aspect of the present teaching, an apparatus for sampling an input voltage includes a first switch having its first terminal connected to an input voltage, and a first pre-charging circuit, coupled to a second terminal of the first switch, to provide a first pre-charged voltage that is substantially equal to the input voltage. The first pre-charged voltage is provided at the first terminal of the first switch before the first switch is turned on. The apparatus further includes a second pre-charging circuit coupled to both the first pre-charging circuit and the second terminal of the first switch, where the second pre-charging circuit charges the first pre-charged voltage prior to the first switch being turned on.

In accordance with another aspect of the present teaching, an apparatus for sampling an input voltage includes a first switch having its first terminal connected to an input voltage and a first pre-charging circuit coupled to a second terminal of the first switch to provide a first pre-charged voltage, substantially equal to the input voltage. The first pre-charged voltage is provided at the first terminal of the first switch before the first switch is turned on. The apparatus also includes a second pre-charging circuit coupled to both the first pre-charging circuit and the second terminal of the first switch, where the second pre-charging circuit is supplied with a second pre-charged voltage by a third pre-charge circuit prior to being pre-charged. The second pre-charging circuit pre-charges after the second pre-charged voltage is supplied and while the first pre-charging circuit is being pre-charged. Furthermore, the first switch remains being turned off until the first pre-charged voltage reaches a level substantially equal to the input voltage.

In yet another aspect of the present teaching, an apparatus for sampling an input voltage includes an analog to digital converter (ADC) configured to sample an input voltage. The ADC comprises a first switch having its first terminal to the input voltage and a second switch having its first terminal coupled to a second terminal of the first switch. The apparatus also includes a first capacitor that couples its first terminal to the first terminal of the second switch and its second terminal to a first voltage. Additionally, the apparatus further includes a filter having an output coupled to a second terminal of the second switch and a digital to analog converter (DAC) having an output coupled to an input of the filter and an input coupled to an output of a quantizer. According to the present teaching, the quantizer generates an output based on an input coupled to the first terminal of the first capacitor.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present teaching relates to voltage sampling in an ADC circuit. Specifically, the disclosed systems and methods achieves more accurate voltage sampling by more robustly pre-charging the voltage in the ADC circuit to an input voltage level based on DAC feedback and employing a filtering technique prior to sampling the input voltage. The disclosed methods and systems enable a reduction of input current ten times when compared with what can be achieved using prior art technologies.

Figure 5:
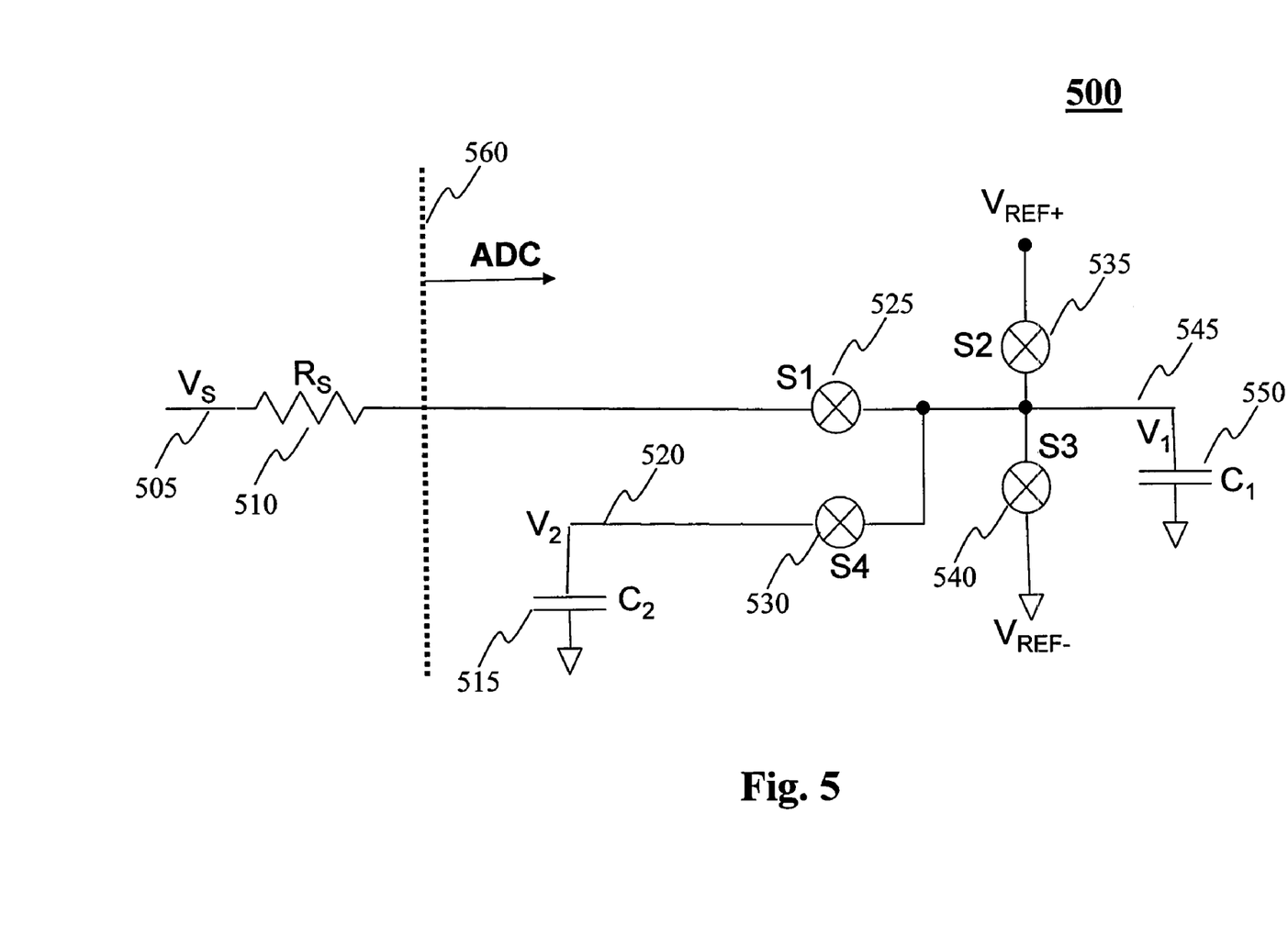
FIG. 5 depicts an exemplary circuit for sampling voltage by pre-charging two capacitors to a desired voltage level based on a plurality of switches.

FIG. 5 depicts an exemplary circuit 500 for sampling voltage in an ADC 560, according to an embodiment of the present teaching. In FIG. 5, the ADC has an input voltage $V_{IN}$ 560, which is connected to a switch S1 (525). In this illustrated embodiment, a voltage pre-charge circuit comprises switch S2 (535), switch S3 (540), switch S4 (530), capacitor C1 (550), and capacitor C2 (515). Switch S2 is connected to a voltage supply $V_{REF+}$ on one end and the other end is connected to switch S3 540. The other end of S3 540 is connected to a different voltage supply $V_{REF-}$. Without loss of generality, $V_{REF+}$ is tied to the ground in the following figures for ease of presentation of the present teaching.

In general, the pre-charge circuit is designed to pre-charge $V_1$ (545) and/or $V_2$ (520) to, e.g., the level of $V_{IN}$ 560. When this is achieved, S1 can then be closed (or turned on). Since at this point, the voltages on both sides of S1 are almost equal, there will be no or minimum current between $V_{IN}$ and $V_1$ and hence, causing minimal voltage drop across $R_s$ 510. This makes the charge injection and nonlinear device capacitance effects on S1 significantly reduced and, hence, enables more accurate voltage sampling.

The pre-charge process is described as follows. Switch S2 535 and switch S3 540 can be turned on and off alternately. For example, switch S2 may be turned on 30% of the time and S3 may be turned on 70% of the time. Thus, based on the output of the feedback DAC, capacitor C1 (550), i.e., $V_1$, is charged to $V_{REF+}$ 30% of the time and $V_{REF-}$ 70% of the time. After switches S2 and S3 are closed, when switch S4 (530) is turned on, the voltages on capacitor C2 (515) and C1 can be equalized. If C2 is pre-charged to $V_N$ and if $C_2 \gg C_1$, then the voltage charged on C1 can be closely approximated to $V_{IN}$. When C1 is charged, switch S4 is turned off and switch S1 is turned on. Since the voltage levels at both sides of switch S1 are almost equal, the amount of input current flowing through resistor $R_s$ is kept at minimum or near zero when switch S1 is turned on or closed.

Simulation was performed with a standard 5V CMOS process. The feedback DAC switched to $V_{REF+}$ 30% of the time and $V_{REF-}$ 70% of the time. In the simulation, $V_{REF-}$ was chosen to be ground and $V_{REF+}$ was 5V. $C_2$ was pre-charged to 1.5V. The input current varied widely depending on the DAC switching. To average the effects, an opened capacitor $C_{IN}$, pre-charged to 1.5V, was placed at the input of the switching arrangement. Current coming in and out of the capacitor increases or decreases the capacitor voltage. By looking at the longer-term change in capacitor voltage, we can deduce the average input current from $I = C_{IN} * dV_{IN}/dt$.

Figure 6A:
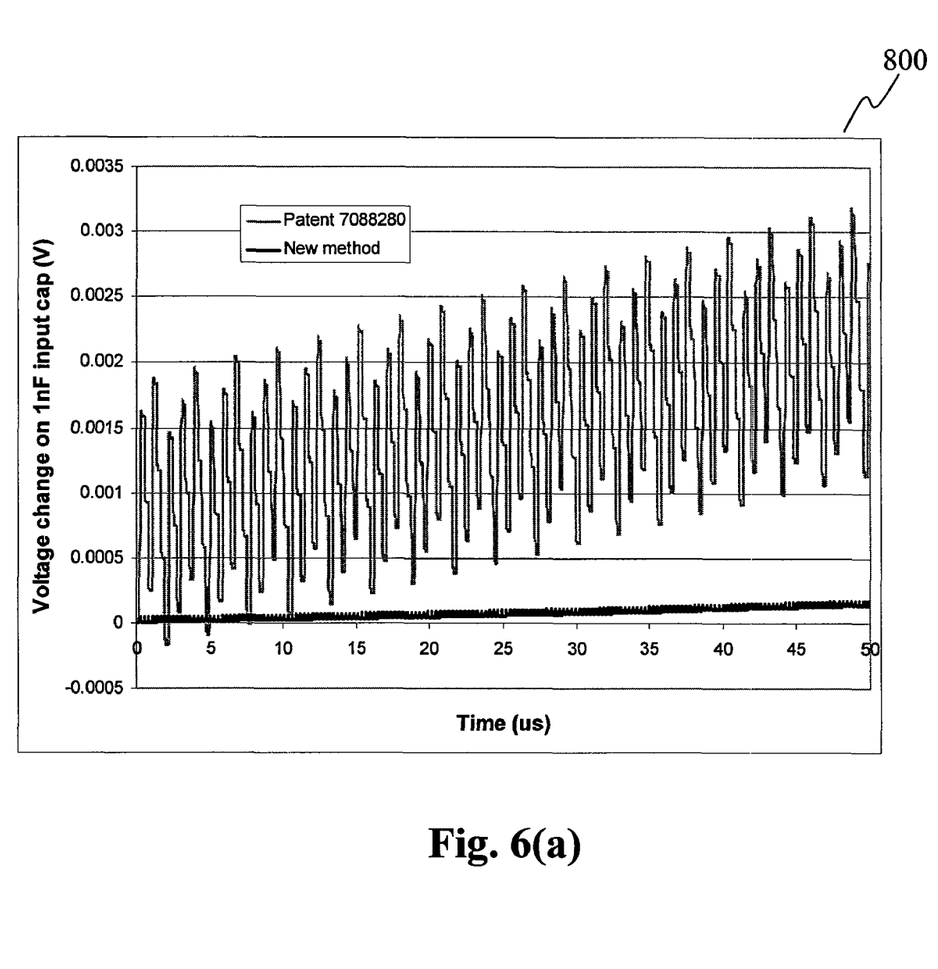
FIG. 6(a) shows a plot of pre-charged voltages over time.

The simulation result is shown in FIG. 6(a), where $C_1$ is set to be 0.3 pF (plus capacitance from device parasitics) and $C_2$ is set to be 1 nF. In the simulation, $C_{IN}=1$ nF. The input current is measured with respect to both the circuit arrangement as described in the U.S. Pat. No. 7,088,280 and the circuit arrangement as disclosed herein. As can be seen in FIG. 6(a), the input current as measured with time from the prior art circuit arrangement is averaged at about 27 nA (see the dotted curve). It can also be seen that the input current measured from the circuit arrangement as disclosed herein is averaged at a level of about 2.7 nA, which represents a substantial reduction of the input current.

One issue related to the present teaching is how to re-charge $C_2$. While a unity-gain buffer can be used for that purpose, $C_2$ can be, asymptotically, be pre-charged to $C_{IN}$, with a rail-to-rail range, using the switching arrangement in FIG. 5. This can be mathematically proven as formulated below. Since switch S1 does not affect the voltage $V_2$, the action of switch S1 can be ignored. The timing of switching is the following. After S1 is turned on (closed) and before S4 is turned off (open), S2 or S3 have been turned off (opened). This is after the circuit pre-charges $C_1$ to either GND or $V_{REF+}$.

Let the charge on $C_1$ before time nT (before S4 is turned on) be $V_1(n-1)$. Let the charge on $C_2$ at time nT (after S4 is turned on) as $V_2(n)$. From conservation of charge, it is known that:

$$V_2(n) = \frac{C_2 V_2(n-1) + C_1 V_1(n-1)}{C_2 + C_1}$$

That is, the voltage pre-charged on $C_2$ is influenced by both the voltage levels $V_1$ and $V_2$ measured at a previous time instance. This equation can be re-written as:

$$V_2(n) = \frac{C_2}{C_2 + C_1} V_2(n-1) + \frac{C_1}{C_2 + C_1} V_1(n-1)$$

Through this re-written form, it is clear that $V_2(n)$ can be solved iteratively. Let the initial value of $V_2$ at $nT=0$ be $V_2(0)$. Also, to simplify the equations, let $$\alpha = C_2/(C_1 - C_2) \quad (1)$$

Then, $$V_2(1) = \alpha V_2(0) + (1-\alpha)V_1(0) \quad (2)$$
$$V_2(2) = \alpha V_2(1) + (1-\alpha)V_1(1)$$
$$= \alpha(\alpha V_2(0) + (1-\alpha)V_1(0)) + (1-\alpha)V_1(1)$$
$$= \alpha^2 V_2(0) + \alpha(1-\alpha)V_1(0) + (1-\alpha)V_1(1) \quad \text{and}$$
$$V_2(3) = \alpha V_2(2) + (1-\alpha)V_1(2) \quad (3)$$
$$= \alpha(\alpha^2 V_2(0) + \alpha(1-\alpha)V_1(0) + (1-\alpha)V_1(1)) +$$
$$= (1-\alpha)V_1(2)$$
$$= \alpha^3 V_2(0) + \alpha^2(1-\alpha)V_1(0) + \alpha(1-\alpha)V_1(1) +$$
$$= (1-\alpha)V_1(2)$$

We can then extrapolate from Equations (2) and (3) to obtain a generalized equation for $V_2$ as follows:

$$V_2(n) = \alpha^n V_2(0) + \sum_{j=0}^{n-1} \alpha^j (1-\alpha) V_1(n-1-j) \quad (4)$$

Since $\alpha < 1$ (see Equation (1)), then, at $n=\infty$, the first item vanishes so that we have:

$$V_2(\infty) = (1-\alpha) \sum_{j=0}^{\infty} \alpha^j V_1(n-1-j) \quad (5)$$

Thus, when the time t approaches infinity ($\infty$), the voltage on $C_2$ is asymptotically becoming completely independent of its own initial condition $V_2(0)$. When this happens, the pre-charged voltage $V_2$ on $C_2$ is a weighted average of the $V_1$ measurements made previously, with the most recent measured voltages mattering the most. To see this, if we assume $V_1$ always equals $V_{IN}$, we have:

$$V_2(\infty) = (1-\alpha) V_1 \sum_{j=0}^{\infty} \alpha^j = (1-\alpha) V_{IN} \frac{1}{1-\alpha} = V_{IN}. \quad (6)$$

Figure 6B:
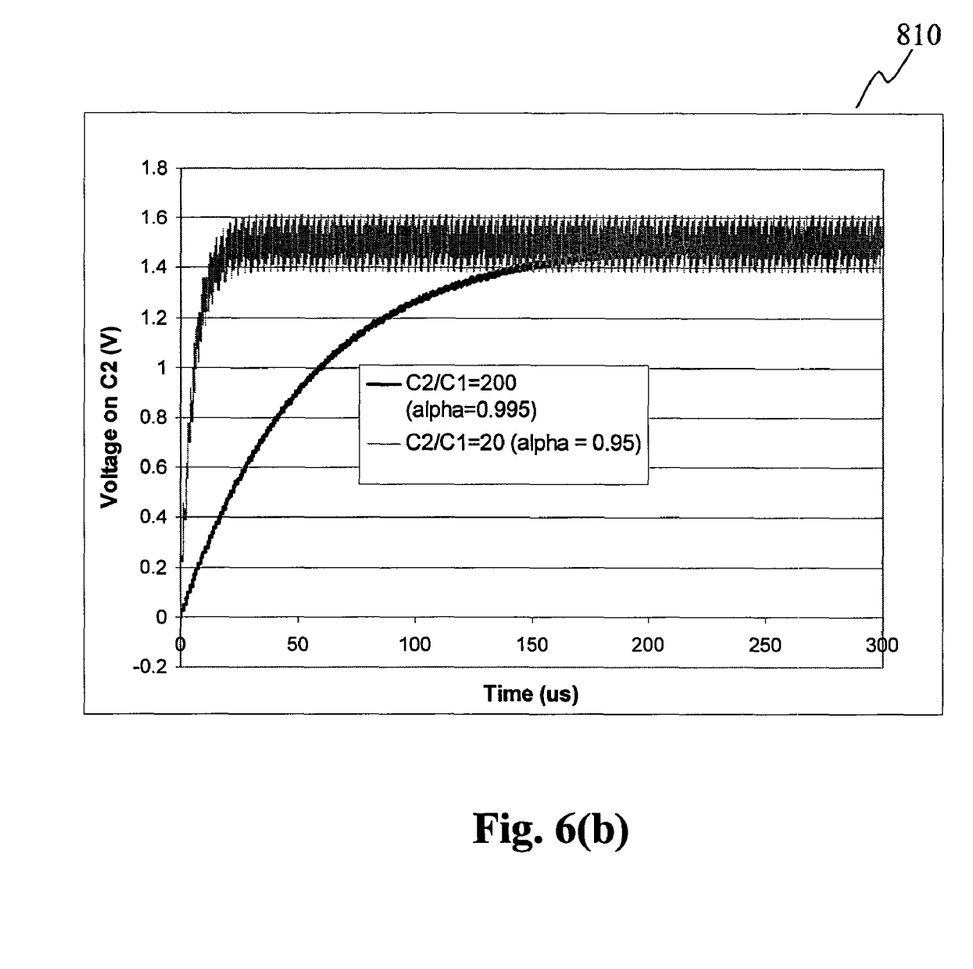
FIG. 6(b) shows a plot of the time required to pre-charge voltage to a certain level, according to an embodiment of the present teaching.

There is then a trade-off in the value of $\alpha$. With smaller values of $\alpha$, the pre-charged $V_2$ depends less on the initial conditions and, thus, a faster pre-charge time. When larger values of $\alpha$ are used, the pre-charged $V_2$ is less susceptible to the current value of $V_1$, leading to a more stable pre-charged voltage. FIG. 6(b) shows some simulation result, in which capacitor $C_2$ is pre-charged to 1.5V, with $V_{REF+}=5V$, S2 is turned on 30% of the time, and S3 is turned on 70% of the time.

As seen in FIG. 6(b), it can take some time to pre-charge $C_2$ to the level of $V_{11}$. During this interim period, there potentially can be substantial input current. In addition, from this plot, it can be seen that the choice of $\alpha$ has an impact as to the time required to pre-charge $C_2$ to a desired level. That is, the choice of $\alpha$ can influence both the time required to pre-charge $C_2$ and how quickly the input current can be dissipated.

Figure 7:
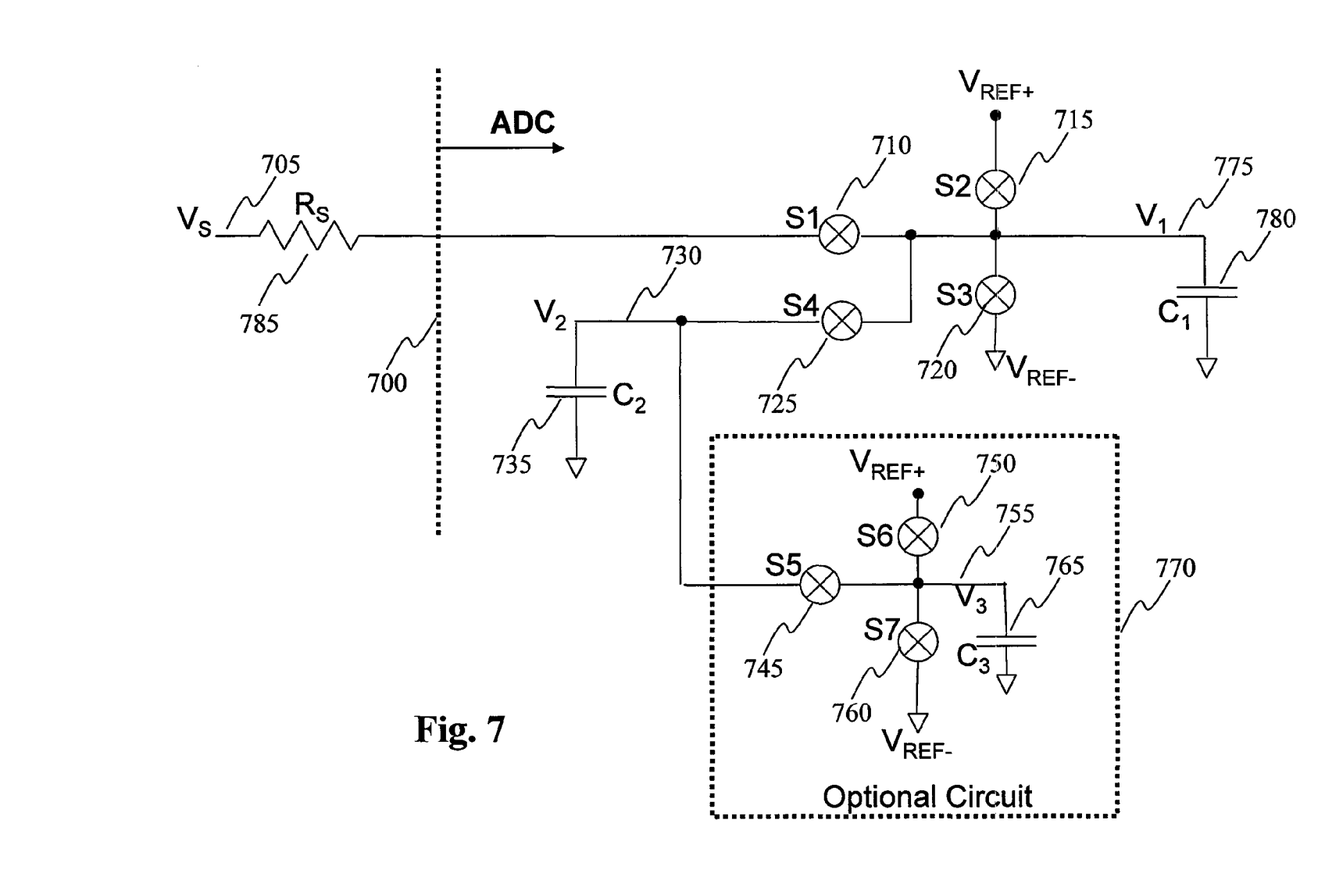
FIG. 7 depicts an exemplary circuit for sampling voltage by pre-charging two capacitors to a desired voltage level with one of the capacitors being pre-charged based on an additional circuit, according to another embodiment of the present teaching.

Such interim input current may also be reduced, particularly when such interim input current is not acceptable in some applications. An additional circuit may be added to the circuit shown in FIG. 5 to reduce the interim input current. One exemplary circuit for that purpose is shown in FIG. 7, in which an optional circuit 770 is introduced to additionally connect with the rest of the circuit, which is described with respect to FIG. 5. Specifically, similar to FIG. 5, the ADC circuit 700 in FIG. 7 comprises switches 710, 715, 720, and 725 and two capacitors, $C_1$ 780 and $C_2$ 735. The circuit is designed to pre-charge $C_2$ to $V_2$ (730) and $C_1$ to $V_1$ (775) and ideally $V_2=V_1=V_{IN}$ (705).

In the exemplary optional circuit 770, as depicted in FIG. 7, switches S5 (745), S6 (750), and S7 (760) are introduced and they are connected to a new capacitor $C_3$ (765). Switches S6 and S7 are also connected to a 1-bit feedback DAC. In some embodiments, S6 750 and S7 760 are connected to the same signals controlling S2 and S3, respectively. That is, $V_{REF+}$ and $V_{REF-}$, respectively. In the illustrated exemplary optional circuit 770, switch S5 745 is connected to one end of switch S4. In some embodiments, switch S5 can also be connected to the other end of switch S4.

The sequence of switching events can be described as follows. With the optional circuit 770, voltage $V_2$ can be pre-charged prior to opening S4. To do so, switch S4 may be first made inactive for a certain amount of time. During this period, switches S5, S6 and S7 are turned on and off in accordance with the description presented herein with respect to S2, S3, and S4. For example, S6 may be switched on 30% of the time and S7 70% of the time to pre-charge $C_2$. During that time, switch S4 may be turned off (open) until the pre-charge of $C_2$ is complete. At that time, switch S4 may be turned on so that $V_1=V_2$. When S4, S2, and S3 are turned on and off in accordance with the description herein to pre-charge both $V_2$ and $V_1$, the fact that $C_2$ is pre-charged to $V_3$ prior to pre-charge $C_2$ makes the time required to pre-charge $C_2$ shorter and a bigger reduction in terms of input current.

When $C_2$ is being pre-charged, in some embodiments, the optional circuit 770 may be inactivated by switching off S5 and switch S4 may be activated. Alternately, one could also keep the optional circuit 770 active after S4 is activated.

To implement the optional circuit 770, one may create $C_3$ out of smaller capacitors connected together by switches. When implemented this way, $C_3$ may not have a constant value and can be made larger during the initial pre-charge and have a reduced capacitance once the voltage on $C_2$ approaches the input voltage.

Figure 8:
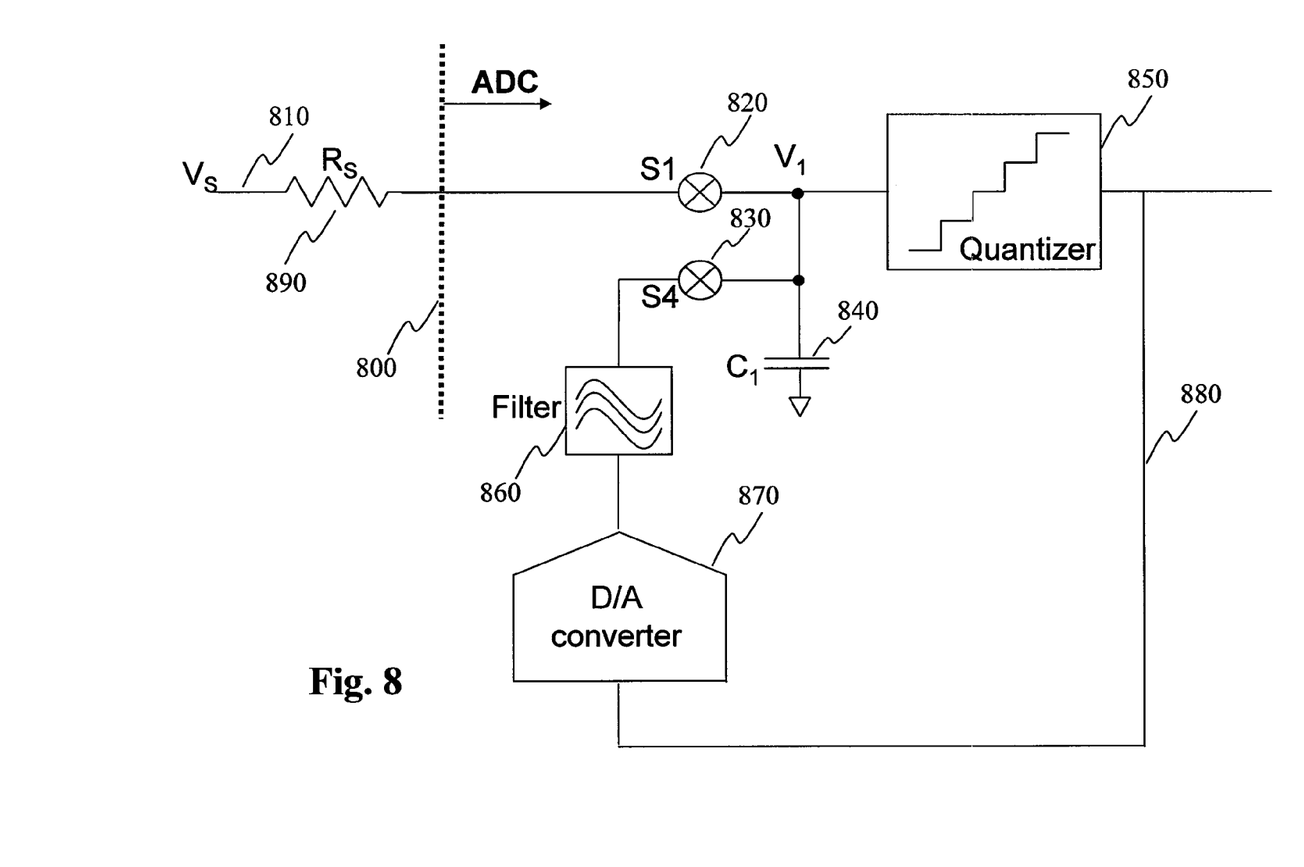
FIG. 8 depicts an exemplary generalized circuit for reducing input current, according to an embodiment of the present teaching.

The systems and methods described herein may be generalized, as depicted in FIG. 8. This generalized circuit comprises an A/D converter 800, a D/A converter 870, and a filter 860 used to reproduce an input signal, which is then used to pre-charge, once switch S4 830 is turned on, the input capacitor $C_1$ (840) to the input voltage $V_1$ (810) before the input switch S1 820 is turned on.

The filter 860 in this exemplary embodiment may be a low-pass filter, which produces a weighted average of the input signal from the D/A converter 870. If the input signal has a known frequency profile, the filter 860 may be modified, for example, to be a band-pass filter. Such a filter can also be appropriately used for a higher-frequency input signal. For extremely high frequencies, a load on the ADC may be deployed to eliminate reflections. Similarly, in such a generalized circuit, one can also introduce the optional circuit 770 as discussed with respect to FIG. 7.

Figure 9:
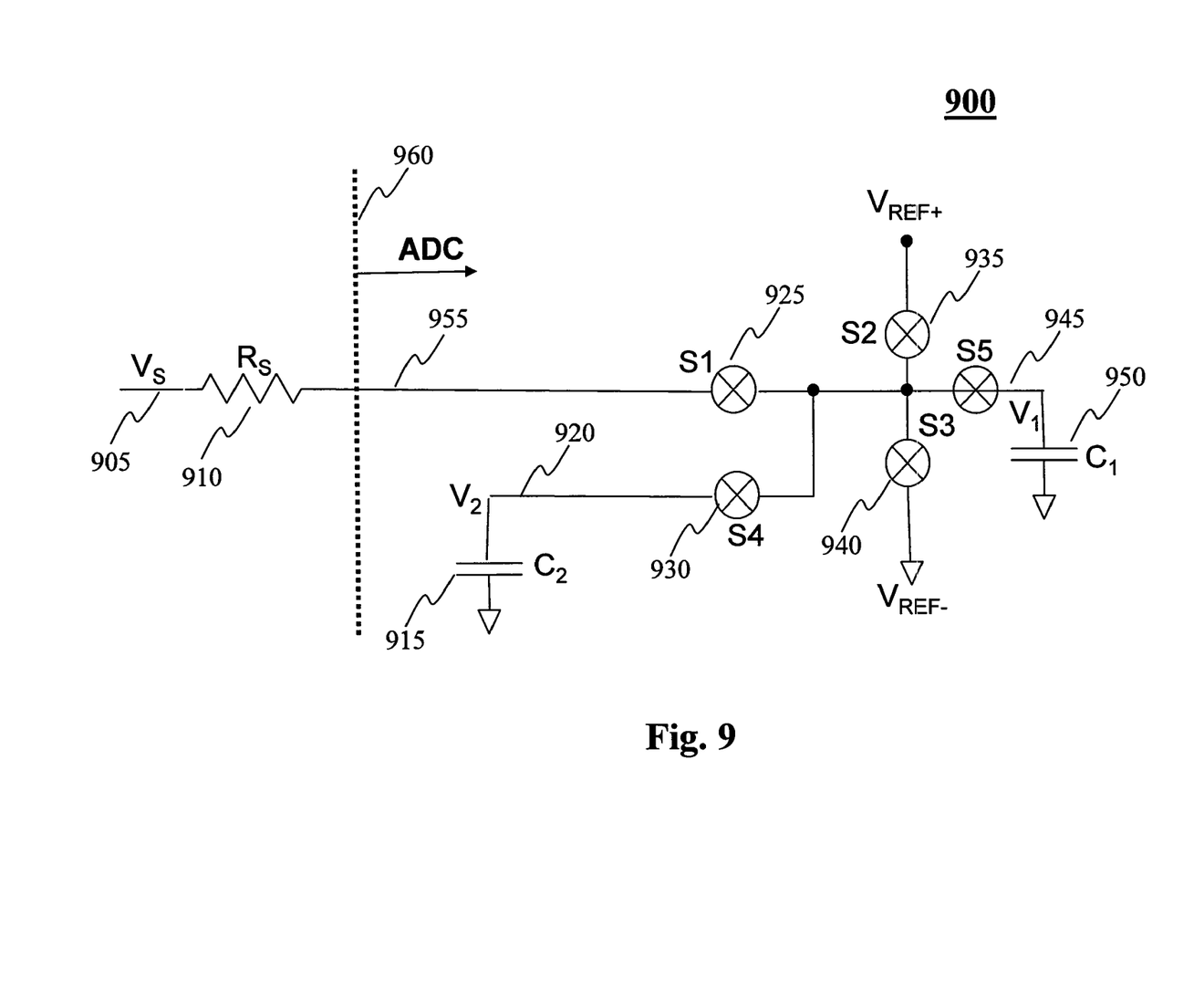
FIG. 9 shows yet another embodiment for sampling an input voltage according to the present teaching.

FIG. 9 shows yet another exemplary circuit for sampling an input voltage according to the present teaching. In this exemplary circuit 900, capacitor C2 915 is used to sample the input voltage $V_{IN}$ 955. Therefore, capacitor C2 is pre-charged to reach a level substantially equal to $V_{IN}$ prior to sampling $V_{IN}$. Switches S1, S2, S3, and S4 (925, 935, 940, and 930) play similar role as corresponding switches in FIG. 5. Switch S5 945 is optional and is designed to isolate C1 from C2 when C2 is used to sample the input voltage when switches S1 and S4 are open. Switch S5 can be implemented either on the right (as shown) or on the left (not shown) of the S2/S3 switches.

To pre-charge C1, it can be done by first open S2 935 and S3 940 based on the same approach as described earlier with respect to FIG. 5 by opening switches S4 930 and S5 945. If S5 is on the right of S2/S3, S5 is also open in order to pre-charge C1. Once C1 is pre-charged, S2 and S3 can be closed and then S4 and S5 are open to equalize V1 and V2. When V1 and V2 are equal, C2 is used to sample the input voltage $V_{IN}$ by opening S1 and S4 and with S5 closed so that C1 is isolated and its capacitance will not contribute to the input current to interfere the sampling.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. An apparatus for voltage sampling, comprising:
   an analog to digital converter (ADC) configured to sample an input voltage, where the ADC comprises:
   a first switch having a first terminal of the first switch connected to the input voltage,
   a second switch having a first terminal of the second switch coupled to a second terminal of the first switch,
   a first capacitor having a first terminal of the first capacitor coupled to the first terminal of the second switch and a second terminal of the first capacitor coupled to a first voltage, the first capacitor being configured to provide a pre-charge voltage, substantially equal to the input voltage, at the second terminal of the first switch before the first switch is turned on; and
   a filter having an output coupled to a second terminal of the second switch, and
   a digital to analog converter (DAC) having an output coupled to an input of the filter and an input coupled to an output of a quantizer, where the quantizer generates the output of the quantizer based on an input coupled to the first terminal of the first capacitor.

2. The apparatus according to claim 1, wherein the filter is one of a low-pass filter and a band-pass filter.

3. The apparatus according to claim 1, wherein the filter provides the first capacitor with a pre-charging signal when the second switch is turned on but before the first switch is turned on.

4. The apparatus according to claim 3, further comprising an additional pre-charging circuit for pre-charging the first capacitor.

* * * * *